US006975115B1

(12) United States Patent
Fujita et al.

(10) Patent No.: US 6,975,115 B1
(45) Date of Patent: Dec. 13, 2005

(54) COIL ARRAYS FOR PARALLEL IMAGING IN MAGNETIC RESONANCE IMAGING

(75) Inventors: Hiroyuki Fujita, Highland Heights, OH (US); Pei H. Chan, Aurora, OH (US); Dashen Chu, Hudson, OH (US); Joseph Murphy-Boesch, Aurora, OH (US); Labros S. Petropoulos, Solon, OH (US); Mark Xueming Zou, Aurora, OH (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/164,664

(22) Filed: Jun. 7, 2002

Related U.S. Application Data

(60) Provisional application No. 60/296,885, filed on Jun. 8, 2001.

(51) Int. Cl.[7] .............................................. G01V 3/00
(52) U.S. Cl. ...................................... 324/318; 324/309
(58) Field of Search ............................... 324/318, 309, 324/307, 319, 322, 300; 600/410

(56) References Cited

U.S. PATENT DOCUMENTS

| | | | | |
|---|---|---|---|---|
| 4,825,162 | A * | 4/1989 | Roemer et al. | 324/318 |
| 5,198,768 | A | 3/1993 | Keren | 324/309 |
| 5,430,378 | A | 7/1995 | Jones | 324/309 |
| 5,477,146 | A | 12/1995 | Jones | 324/309 |
| 5,548,218 | A | 8/1996 | Lu | 324/309 |
| 5,910,728 | A * | 6/1999 | Sodickson | 324/309 |
| 6,169,401 | B1 | 1/2001 | Fujita et al. | 324/309 |
| 6,236,203 | B1 | 5/2001 | Shvartsman et al. | 324/309 |
| 6,469,506 | B1 * | 10/2002 | Felmlee et al. | 324/309 |
| 6,476,606 | B2 * | 11/2002 | Lee | 324/309 |
| 6,556,010 | B2 * | 4/2003 | Brink | 324/309 |

OTHER PUBLICATIONS

Pruessmann et al; SENSE: Sensitivity Encoding for Fast MRI; Magnetic Resonance in Medicine vol. 42, pp. 952-962; 1999.*

"Simultaneous Acquisition of Spatial Harmonics (SMASH): Fast Imaging with Radiofrequency Coil Arrays," Daniel K. Sodickson and Warren J. Manning, Magnetic Resonance in Medicine 38:591-603 (1997).

"SENSE: Sensitivity Encoding for Fast MRI," Klaas P. Pruessmann, et al., Magnetic Resonance in Medicine 42: 952-962 (1999).

"A multicoil array designed for cardiac SMASH imaging," Mark A. Griswold, et al., Magnetic Resonance Materials in Physics, Biology and Medicine 10 (2000) 105-113.

"SMASH imaging with an eight element multiplexed RF coil array," James A. Bankson, et al., Magnetic Resonance Materials in Physics, Biology and Medicine 10 (2000) 93-104.

(Continued)

*Primary Examiner*—Brij B. Shrivastav
(74) *Attorney, Agent, or Firm*—Carl B. Horton, Esq.; Armstrong Teasdale LLP

(57) ABSTRACT

A partially parallel acquisition RF coil array for imaging a sample includes at least a first, a second and a third coil adapted to be arranged circumambiently about the sample and to provide both contrast data and spatial phase encoding data.

20 Claims, 11 Drawing Sheets

OTHER PUBLICATIONS

"An array that exploits phase for SENSE imaging," Joseph V. Hajnal, et al., International Society for Magnetic Resonance in Medicine, 8th Scientific Meeting & Exhibition, Proceedings, 1719, (2000).
"A 4 channel head coil for SENSE imaging," D. J. Herlihy, et al., International Society for Magnetic Resonance in Medicine, 8thScientific Meeting & Exhibition, Proceedings, 1394, (2000).
"Planar Strip Array (PSA) for MRI," Ray F. Lee, et al., Magnetic Resonance in Medicine 45:673-683 (2001).
"Concentric Coil Arrays for Spatial Encoding in Parallel MRI," Michael A. Ohliger, et al., International Society for Magnetic Resonance in Medicine, 9th Scientific Meeting & Exhibition, Proceedings, 21, (2001).
"Specific Coil Design for SENSE: A Six-Element Cardiac Array," Markus Weiger, et al., Magnetic Resonance in Medicine 45:495-504 (2001).
"SMASH and SENSE: Experimental and Numerical Comparisons," Bruno Madore and Norbert J. Pelc, Magnetic Resonance in Medicine 45:1103-1111 (2001).

* cited by examiner

COIL ARRAYS FOR PARALLEL IMAGING IN MAGNETIC RESONANCE IMAGING

CROSS-REFERENCE TO RELATED APPLICATION

This application claims the benefit of U.S. provisional patent application Ser. No. 60/296,885 filed Jun. 8, 2001.

BACKGROUND OF THE INVENTION

The present invention relates to magnetic resonance imaging (MRI) systems, and particularly to the radio frequency (RF) coils used in such systems.

Magnetic resonance imaging (MRI) utilizes hydrogen nuclear spins of the water molecules in the human body or other tissue, which are polarized by a strong, uniform, static magnetic field generated by a magnet (referred to as $B_0$—the main magnetic field in MRI physics). The magnetically polarized nuclear spins generate magnetic moments in the human body. The magnetic moments point in the direction of the main magnetic field in a steady state, and produce no useful information if they are not disturbed by any excitation.

The generation of nuclear magnetic resonance (NMR) signal for MRI data acquisition is achieved by exciting the magnetic moments with a uniform radio frequency (RF) magnetic field (referred to as the $B_1$ field or the excitation field). The $B_1$ field is produced in the imaging region of interest by an RF transmit coil which is driven by a computer-controlled RF transmitter with a power amplifier. During the excitation, the nuclear spin system absorbs magnetic energy, and its magnetic moments precess around the direction of the main magnetic field. After the excitation, the precessing magnetic moments will go through a process of free induction decay, emitting their absorbed energy and then returning to the steady state. During the free induction decay, NMR signals are detected by the use of a receive RF coil, which is placed in the vicinity of the excited volume of the human body. The NMR signal is an induced electrical motive force (voltage), or current, in the receive RF coil that has been induced by the flux change over some time period due to the relaxation of precessing magnetic moments in the human tissue. This signal provides the contrast information of the image. The receive RF coil can be either the transmit coil itself, or an independent receive-only RF coil. The NMR signal is used for producing magnetic resonance images by using additional pulsed magnetic gradient fields, which are generated by gradient coils integrated inside the main magnet system. The gradient fields are used to spatially encode the signals and selectively excite a specific volume of the human body. There are usually three sets of gradient coils in a standard MRI system, which generate magnetic fields in the same direction of the main magnetic field, varying linearly in the imaging volume.

In MRI, it is desirable for the excitation and reception to be spatially uniform in the imaging volume for better image uniformity. In a standard MRI system, the best excitation field homogeneity is usually obtained by using a whole-body volume RF coil for transmission. The whole-body transmit coil is the largest RF coil in the system. A large coil, however, produces lower signal-to-noise ratio (S/N) if it is also used for reception, mainly because of its greater distance from the signal-generating tissues being imaged. Since a high signal-to-noise ratio is the most desirable factor in MRI, special-purpose coils are used for reception to enhance the S/N ratio from the volume of interest.

In practice, a well-designed specialty RF coil should have the following functional properties: high S/N ratio, good uniformity, high unloaded quality factor (Q) of the resonance circuit, and high ratio of the unloaded to loaded Q factors. In addition, the coil device must be mechanically designed to facilitate patient handling and comfort, and to provide a protective barrier between the patient and the RF electronics. Another way to increase the S/N is by quadrature reception. In this method, NMR signals are detected in two orthogonal directions, which are in the transverse plane or perpendicular to the main magnetic field. The two signals are detected by two independent individual coils which cover the same volume of interest. With quadrature reception, the S/N can be increased by up to $\sqrt{2}$ over that of the individual linear coils.

To cover a large field-of-view, while maintaining the S/N characteristic of a small and conformal coil, a linear surface coil array technique was created to image the entire human spines (U.S. Pat. No. 4,825,162). Subsequently, other linear surface array coils were used for C.L. spine imaging, such as the technique described in U.S. Pat. No. 5,198,768. These two devices consist of an array of planar linear surface coil elements. These coil systems do not work well for imaging deep tissues, such as the blood vessels in the lower abdomen, due to sensitivity drop-off away from the coil surface.

To image the lower extremities, quadrature phased array coils have been utilized such as described in U.S. Pat. Nos. 5,430,378 and 5,548,218. The first quadrature phased array coil, images the lower extremities by using two orthogonal linear coil arrays: six planar loop coil elements placed in the horizontal plane and underneath the patient and six planar loop coil elements placed in the vertical plane and in between the legs. Each linear coil array functions in a similar way as described in U.S. Pat. No. 4,825,162 (Roemer). The second quadrature phased array coil (Lu) was designed to image the blood vessels from the pelvis down. This device also consists of two orthogonal linear coil arrays extending in the head-to-toe direction: a planar array of loop coil elements laterally centrally located on top of the second array of butterfly coil elements. The loop coils are placed immediately underneath the patient and the butterfly coils are wrapped around the patient. Again, each linear coil array functions in a similar way as described in U.S. Pat. No. 4,825,162.

In MRI, gradient coils are routinely used to give phase-encoding information to a sample to be imaged. To obtain an image, it is required that all the data points in a so-called "k-space" (i.e., frequency space) must be collected. Recently, there have been developments where some of the data points in k-space are intentionally skipped and at the same time use the intrinsic sensitivity information of RF receive coils as the phase-encoding information for those skipped data points. This action takes place simultaneously, and thus is referred to as partially parallel imaging or partially parallel acquisition (PPA). By collecting multiple data points simultaneously, it requires less time to acquire the same amount of data, when compared with the conventional gradient-only phase-encoding approach. The time savings can be used to reduce total imaging time, in particular, for the applications in which cardiac or respiratory motions in tissues being imaged become concerns, or to collect more data to achieve better resolution or S/N. SiMultaneous Acquisition of Spatial Harmonics, SMASH, (U.S. Pat. No. 5,910,728 and "Simultaneous Acquisition of Spatial Harmonics (SMASH): Fast Imaging with Radiofrequency Coil Arrays," Daniel K. Sodickson and Warren J. Manning, Magnetic Resonance in Medicine 38:591–603 (1997), both incorporated herein by reference) and "SENSE: Sensitivity Encoding for Fast MRI," Klaas P. Pruessmann, et al., Magnetic Resonance in Medicine 42:952–962 (1999, also incorporated by reference, are basically two methods of PPA. SMASH takes advantage of the parallel imaging by skipping phase encode lines that yield decreasing the Field-of-View (FOV) in the phase-encoding direction and uses coils (e.g., coil arrays) together with reconstruction techniques to fill in the missing data points in k-space. SENSE, on the other hand, is a technique that utilizes a reduced FOV in the read direction, resulting an aliased image that is then unfolded in x-space (i.e., real space), while using the RF coil sensitivity information, to obtain a true corresponding image. Here, we make use of phase difference between signals from multiple coils to skip phase encoding steps. By skipping some of the phase encoding steps, one can achieve speeding up imaging process by a reduction factor R. Theoretically speaking, the factor R should equal the number of independent coils/arrays. In the SENSE approach, the SIR is defined as:

$$SNR_{SENSE}=SNR_{FULL}/\{g\sqrt{R}\}$$

where $SNR_{FULL}$ is the S/N achievable when all the phase encoding steps are collected by traditional gradient phase encoding scheme. $SNR_{SENSE}$ is optimized when the geometry factor g equals 1. To obtain g of 1, traditional decoupling techniques such as overlapping nearest neighbor elements to null the mutual inductance between them shall not apply, as have been reported by others.

SENSE and SMASH or a hybrid approach of both demand a new type of design requirements in RF coil design. In SMASH, the primary criterion for the array is that it be capable of generating sinusoids whose wavelengths are on the order of the FOV. This is how the target FOV along the phase encoding direction for the array is determined. Conventional array designs can incorporate element and array dimensions that will give optimal S/N for the object of interest. In addition, users of conventional arrays are free to choose practically any FOV, as long as severe aliasing artifacts are not a problem. In contrast, when using SMASH, the size of the array determines the approximate range of FOVs that can be used in the imaging experiment. This then determines the approximate element dimensions, assuming complete coverage of the FOV is desired, as in most cases. In SENSE, the method is based upon the fact that the sensitivity of a RF receiver coil generally has a phase-encoding effect complementary to those achieved by linear field gradients. For SENSE imaging, the elements of a coil array should be smaller than for common phased-array imaging, resulting in a trade-off between basic noise and geometry factor, and adjacent coil elements should not overlap for a net gain in S/N due to the improved geometry factor when using SENSE.

For PPA applications, different types of RF coils or arrays have been used so far. However, most of them are based upon "traditional" RF coil design requirements, thus remain within the conventional coil design scheme. It has been reported, however, that since the phase information of $B_1$ of a receive coil is very important when SENSE applications are demanded, for example, new coil design techniques such as non-overlapping adjacent coil elements may be necessary for better definition of the individual phase information associated with each RF coil used in an array, unlike traditional design scheme where two adjacent coils elements are overlapped to null the mutual inductance between the elements (U.S. Pat. No. 4,825,162). Without overlap, the coupling may be increased, but there is a net gain in S/N due to the improved geometry factor when using SENSE. As stated in the above, the use of smaller coil-elements than those for conventional imaging results in a trade-off between basic noise and geometry factor.

SUMMARY OF THE INVENTION

A partially parallel acquisition RF coil array for imaging a sample includes at least a first, a second and a third coil adapted to be arranged circumambiently about the sample and to provide both contrast data and spatial phase encoding data.

DESCRIPTION OF THE PREFERRED EMBODIMENTS

As is seen from the equation above, we loose S/N intrinsically when we try to reduce the imaging time. Thus, to compensate for S/N loss, we design the size of each element smaller than that of conventional array elements.

We also increase the total number of elements to cover the volume of interest (which may be constrained by the maximum available number of receiver channels).

The present invention provides an improved and advanced volume and surface coil array that covers a large field-of-view while providing greater S/N and can be used as a PPA targeted coil for imaging a large volume such as head, abdomen or heart.

The present invention may also employ various combinations of coils distributed not only in circumambient directions but also in the z direction and provide better S/N for the torso and cardiac imaging as compared with a conventional torso/cardiac coil.

The basic building blocks of the present invention are the well-known coil configurations of FIGS. 1 through 6.

Figure 1:
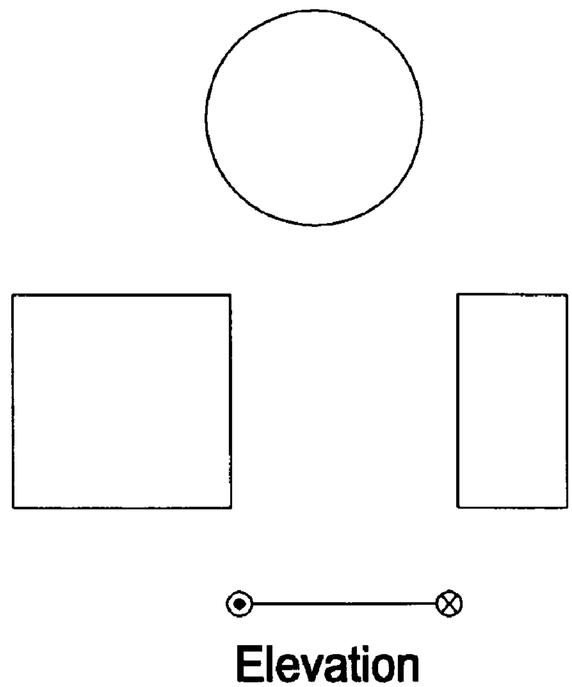
FIG. 1 is plan and elevation views of a schematic diagram of exemplary circular, rectangular or arbitrary-shaped loop coils.

FIG. 1 shows a circular, a rectangular and an arbitrary-shaped loop. These elements produce a useful $B_1$ field normal to the plane defined by the elements.

Figure 2:
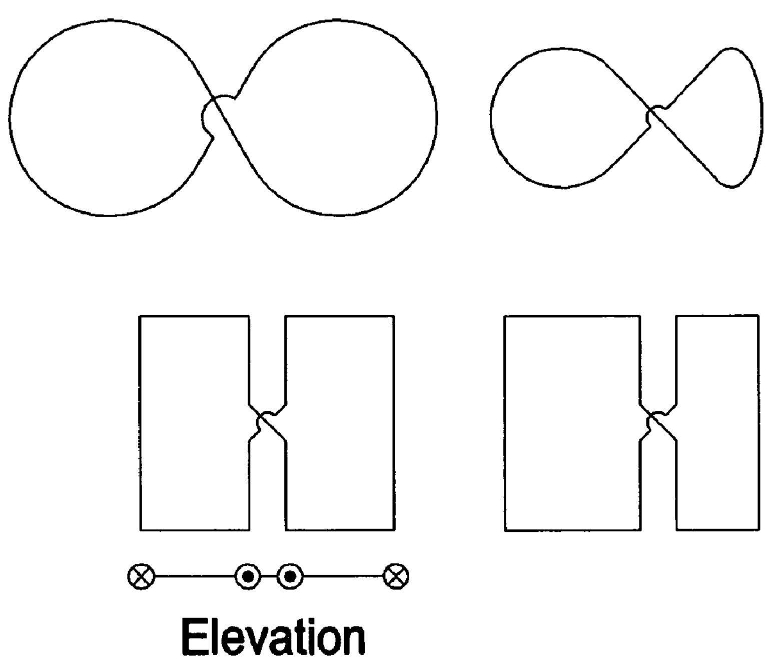
FIG. 2 is plan and elevation views of a schematic diagram of exemplary saddle/"Figure 8" coils.
Figure 8:
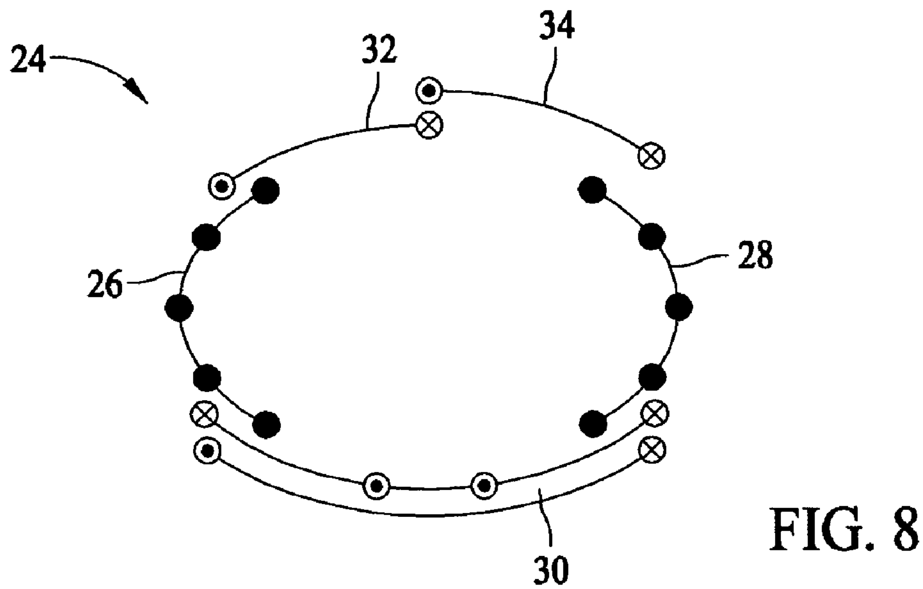
FIG. 8 is an elevation view of a schematic diagram of a second exemplary coil array according to the invention.

FIG. 2 shows a so-called "Figure-8", a symmetric/asymmetric saddle, and an arbitrary-shaped crossed coil. They can be placed flat or conformed to some curvature. These elements produce a useful $B_1$ field parallel to the plane defined by the elements.

Figure 3:
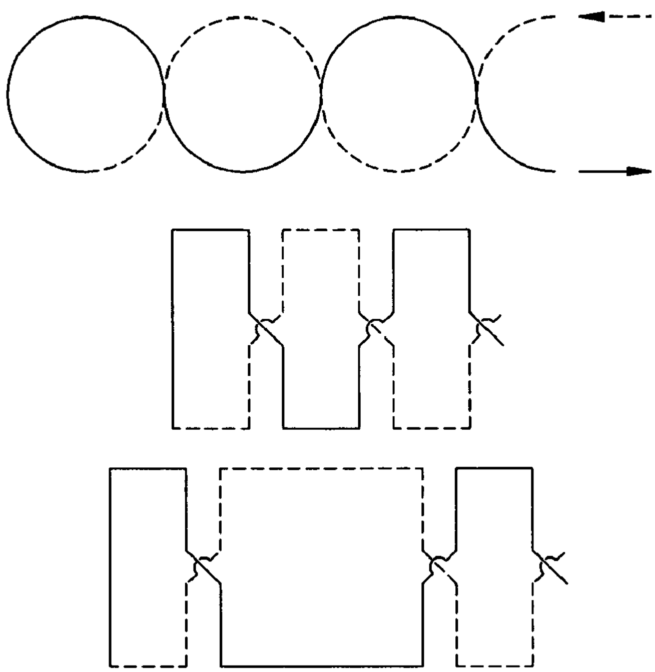
FIG. 3 is plan views of a schematic diagram of exemplary saddle-train and "Figure 8"-train coils.

FIG. 3 shows a so-called "Figure-8" train, a symmetric/asymmetric saddle train, and an arbitrary-shaped crossed coil train. They can be placed flat or conformed to some curvature. These elements produce a useful $B_1$ field parallel to the plane defined by the elements.

Figure 4:
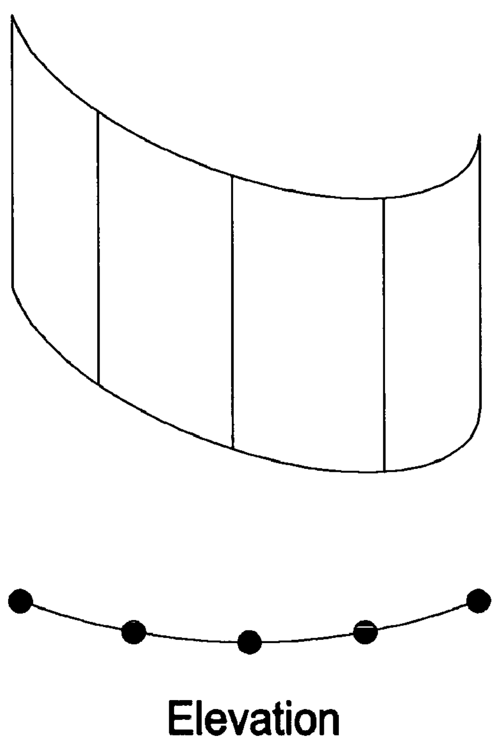
FIG. 4 is perspective and elevation views of a schematic diagram of an exemplary ladder multi-mode coil or half-bird cage coil.

FIG. 4 shows a "ladder" coil or a "half-birdcage" coil if curved around a volume of interest. The element has multiple resonant modes. For example, by exciting appropriate modes of the element, this coil can generate both a $B_1$ field normal to and a $B_1$ field parallel to the plane defined by the coil at the same imaging frequency. Other modes may be excited depending upon the application of interest.

Figure 5:
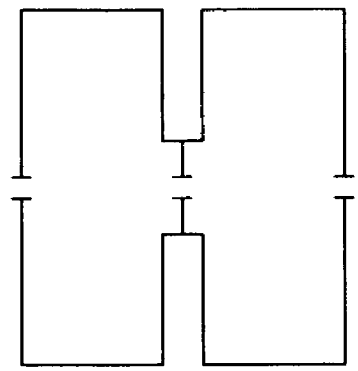
FIG. 5 is a plan view of a schematic diagram of an exemplary "H" multi-mode coil.

FIG. 5 shows a so-called "H" coil and is also a multi-mode coil.

Figure 6A:
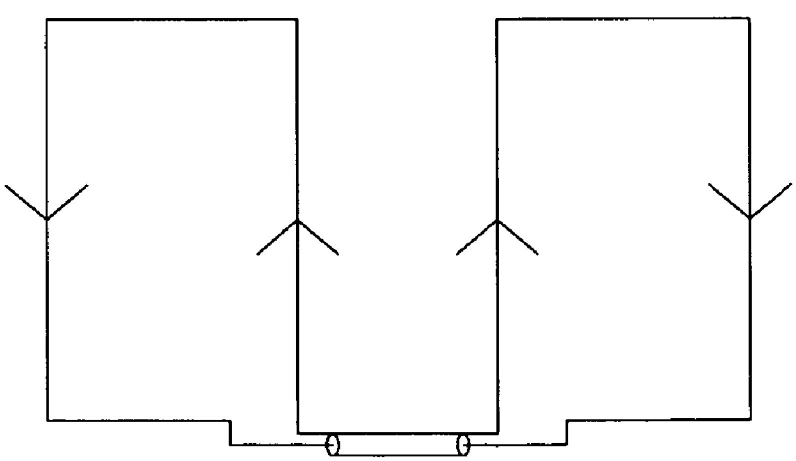
FIG. 6 is plan views of a schematic diagram of exemplary mode-controlled loop pair coils (MCLP coils) (connection between two loops can be a rigid/flexible coaxial cable, balanced transmission line type of cable such as 300 ohm TV cable, or can be etched strip line transmission lines with high characteristic impedance, greater or equal to 50 ohms, for example).

FIG. 6*a* shows an A-type mode-controlled loop pair coil (MCLP coil). The $B_1$ magnetic field polarization depends upon how the cable is connected to the coils.

Figure 6B:
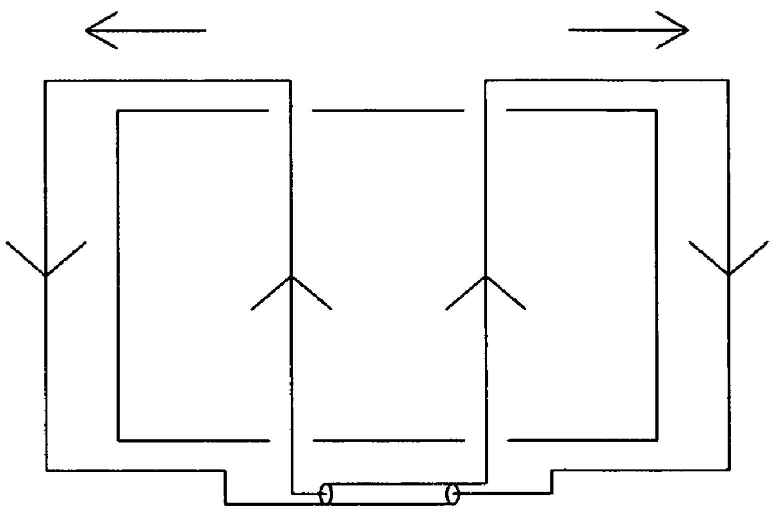

FIG. 6*b* shows a B-type mode-controlled loop pair coil (MCLP coil) shown in solid lines. The B-type MCLP coil is shown with a loop coil in phantom lines, constituting a quadrature coil. Thus, the B-type MCLP coil functions as a well known "Figure 8" or saddle coil.

Figure 6C:
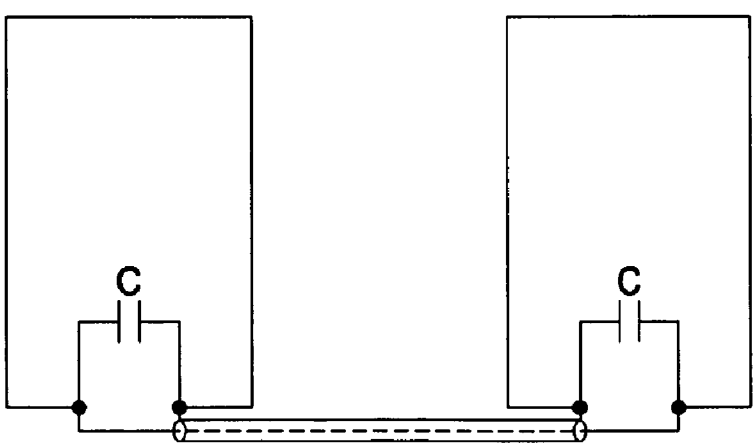

FIG. 6*c* shows an AB-type mode-controlled loop pair coil (MCLP coil). The AB-type MCLP coil is independent of cable connection (polarity). For this to function, the cable becomes high capacitance (relative to 50 ohms; large capacitance= comparable or greater than 50 ohms; small capacitance=much less than 50 ohms, e.g., 20 ohms).

Figure 6D:
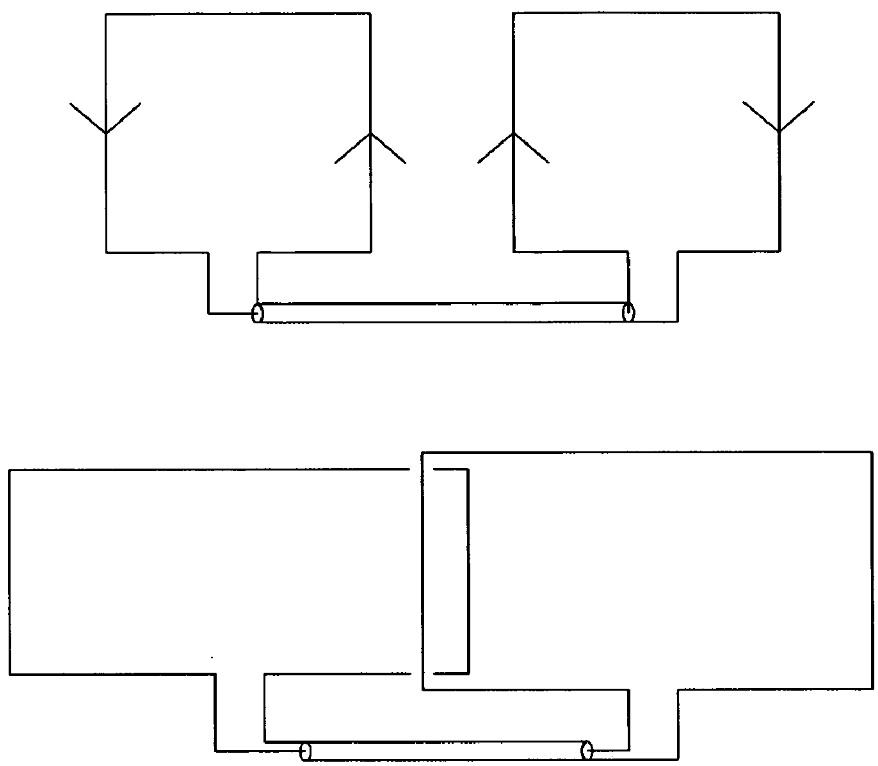

FIG. 6*d* shows a mode-controlled loop pair coil (MCLP coil). By adjusting the cable length, the overlap area can be controlled. This MCLP coil functions as a "Figure-8" or saddle coil.

These coil configurations are combined into an array of smaller and more numerous coils than was contemplated in the past.

Figure 7:
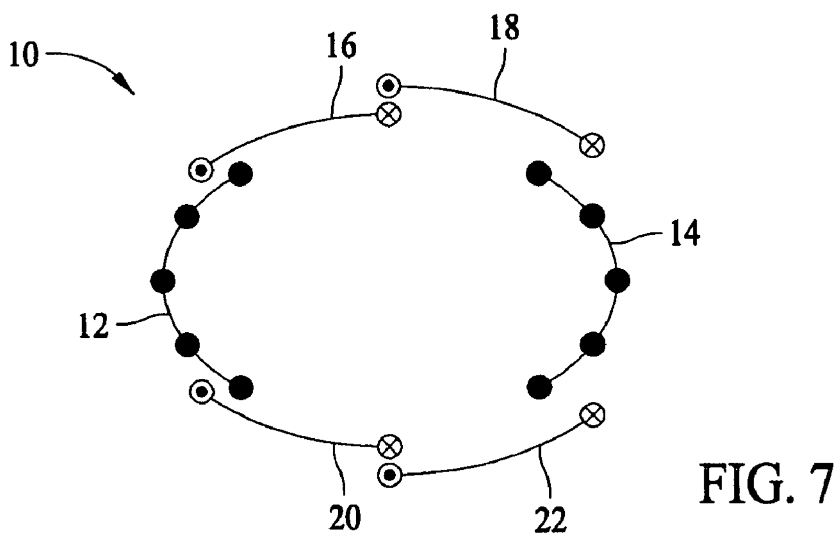
FIG. 7 is an elevation view of a schematic diagram of a first exemplary coil array according to the invention.

Referring to FIG. 7, this is a coil array 10 where combinations of quadrature ladder/half-birdcage coils 12, 14 are used together with loops coils 16, 18, 20, 22 whose sizes are optimized for S/N. The quadrature ladder/half-birdcage coil sections may be replaced by "H" coils or a combination of loop and "Figure 8" (saddle) coils. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Referring to FIG. 8, this is a coil array 24 where combinations of different type of quadrature coils (i.e., ladder/half-birdcage coils 26, 28, a loop-and-butterfly quadrature coil 30 are used for giving distinct phase information together with loop coils 32, 34 whose sizes are optimized for PPA applications and S/N. The ladder/half-birdcage sections may be replaced by "H" coils or a combination of loop and "Figure 8" (saddle) coils. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Figure 9:
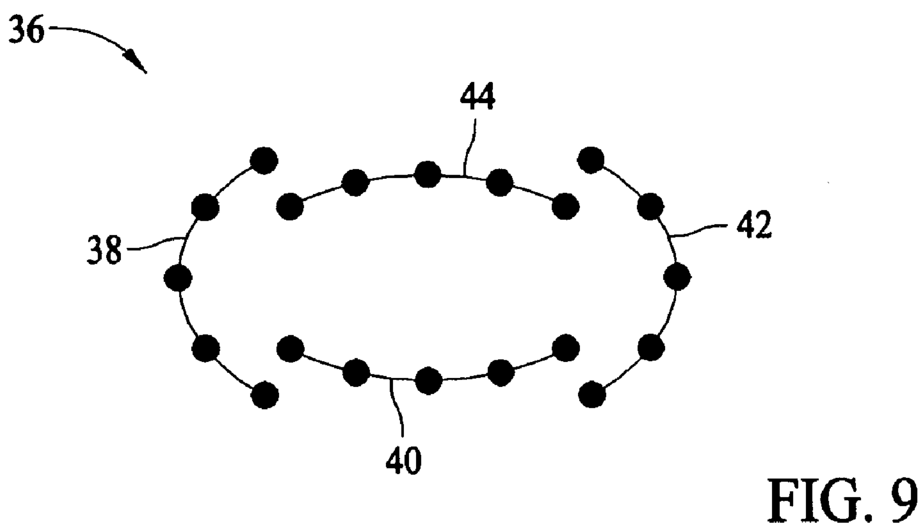
FIG. 9 is an elevation view of a schematic diagram of a third exemplary coil array according to the invention.

Referring to FIG. 9, this is a coil array 36 where combinations of quadrature ladder/half-birdcage coils 38, 40, 42, 44 are used. The quadrature ladder/half-birdcage sections may be replaced by "H" coils or a combination of loop and "Figure 8" (saddle) coils. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in SNR due to the improved geometry factor when using SENSE.

Figure 10:
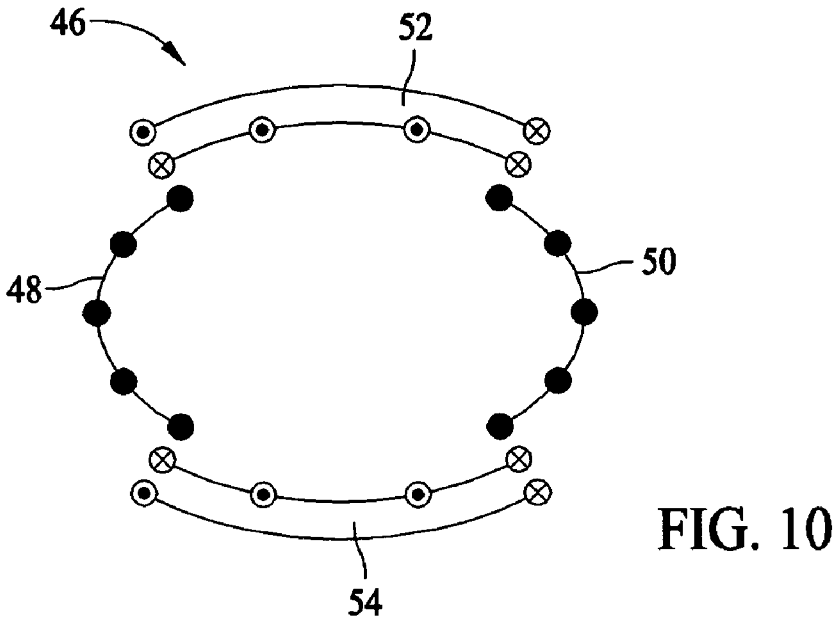
FIG. 10 is an elevation view of a schematic diagram of a fourth exemplary coil array according to the invention.

Referring to FIG. 10, this is a coil array 46 where combinations of quadrature ladder/half-birdcage coils 48, 50 are used together with another type of quadrature coils, namely, a combination of a loop and a butterfly coils 52, 54. The quadrature ladder/half-birdcage coils may be replaced by "H" coils or a combination of loop and "Figure 8" (saddle) coils. The sizes of the loop and the butterfly coils are chosen such that B1 field penetrates deep enough so as to tissues at the center region can be imaged with high S/N. This applies to the quadrature ladder/half-birdcage sections. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Figure 11:
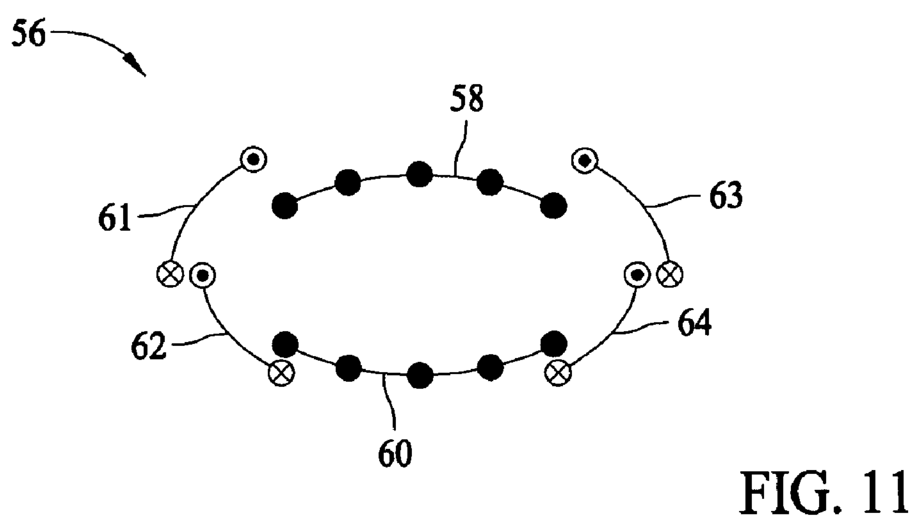
FIG. 11 is an elevation view of a schematic diagram of a fifth exemplary coil array according to the invention.

Referring to FIG. 11, this is a coil array 56 where combinations of quadrature ladder/half-birdcage coils 58, 60 are used together with loop coils 61, 62, 63, 64. The quadrature ladder/half-birdcage sections may be replaced by "H" coils or a combination of loop and "Figure 8" (saddle) coils. The sizes of the loop coils are optimized for S/N. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Figure 12:
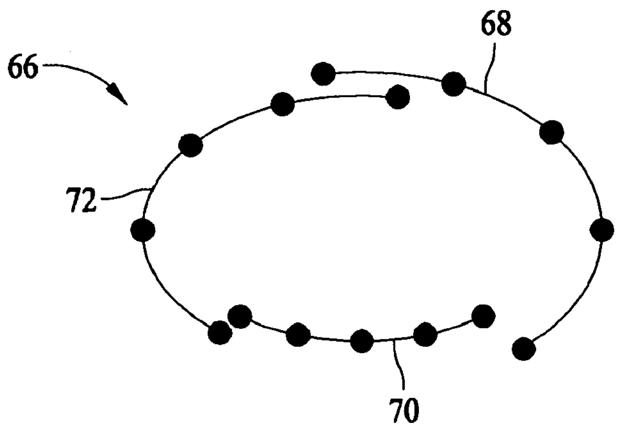
FIG. 12 is an elevation view of a schematic diagram of a sixth exemplary coil array according to the invention.
Figure 13:
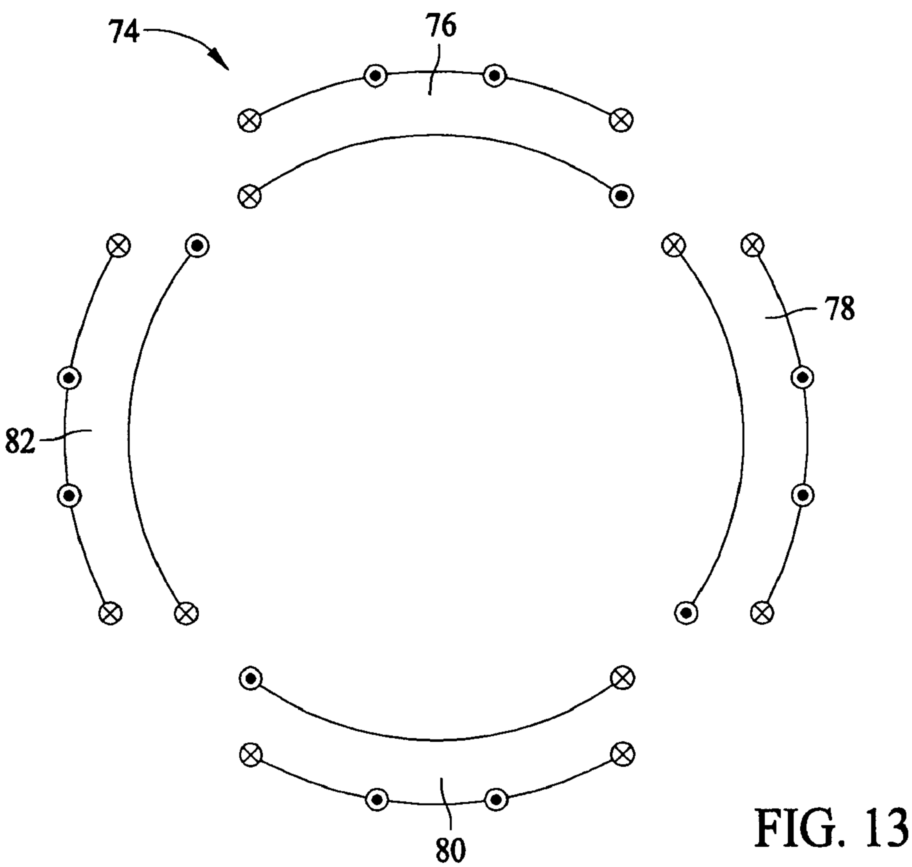
FIG. 13 is an elevation view of a schematic diagram of a seventh exemplary coil array according to the invention.

Referring to FIG. 12, this is a coil array 66 where combinations of quadrature ladder/half-birdcage coils 68, 70, 72 are used, each having different curvature and size for optimized S/N. The quadrature ladder/half-birdcage sections may be replaced by "H" coils or a combination of loop and "Figure 8" (saddle) coils. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

referring to FIG. 13, this is a coil array 74 where combinations of quadrature coils 76, 78, 80, 82 are used. A configuration where adjacent coils are not overlapped is shown since this non-overlapping configuration yields better phase definition associated with each coil. A low-input impedance preamplifier decoupling technique ensures adequate decoupling of neighboring coils (i.e., mutual inductance between adjacent coils are minimized). Traditional decoupling technique such as overlapping adjacent coils is possible, too. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Figure 14:
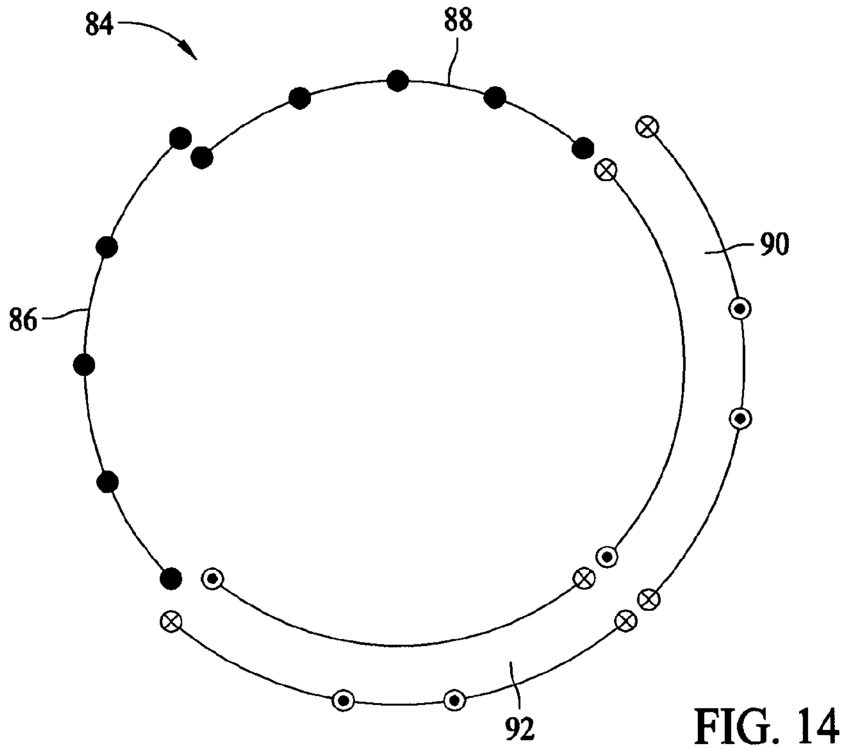
FIG. 14 is an elevation view of a schematic diagram of an eighth exemplary coil array according to the invention.

Referring to FIG. 14, this is a coil array 84 where combinations of quadrature coils 86, 88, 90, 92 are used. The ladder/half-birdcage sections 86, 88 may be replaced for example, by "H" coils or a combination of loop and "Figure 8" (saddle) coils. A configuration where adjacent coils are not overlapped is shown since this non-overlapping configuration yields better phase definition associated with each coil. A low-input impedance preamplifier decoupling technique ensures adequate decoupling of neighboring coils (i.e., mutual inductance between adjacent coils are minimized). Traditional decoupling technique such as overlapping adjacent coils is possible, too. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Figure 15:
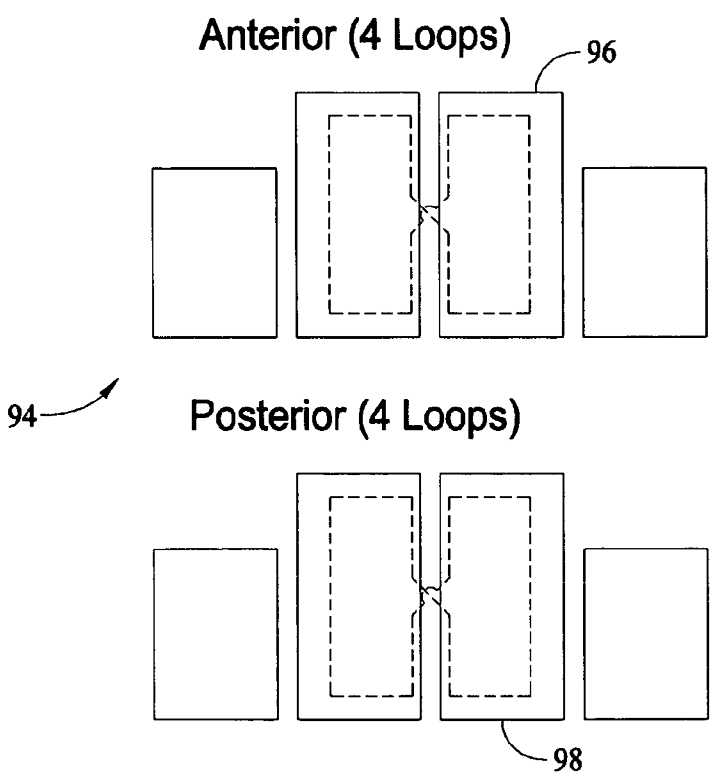
FIG. 15 is a plan view of a schematic diagram of a ninth exemplary coil array according to the invention.

Referring to FIG. 15, this a coil array 94 for torso imaging. Anterior part 96 and posterior part 98 are made of differently sized loops for the optimized S/N. They may be flat or curved. Loops shown in solid lines are positioned to optimize imaging of a region of interest, and they may be overlapped for improved decoupling between adjacent loops or non-overlapped for a net gain in S/N due to the improved geometry factor when using SENSE. Shown in dashed lines are saddle or "Figure-8" coils. When they are placed on top of the loops as shown in FIG. 14, improvement in SIR is achieved.

Figure 16:
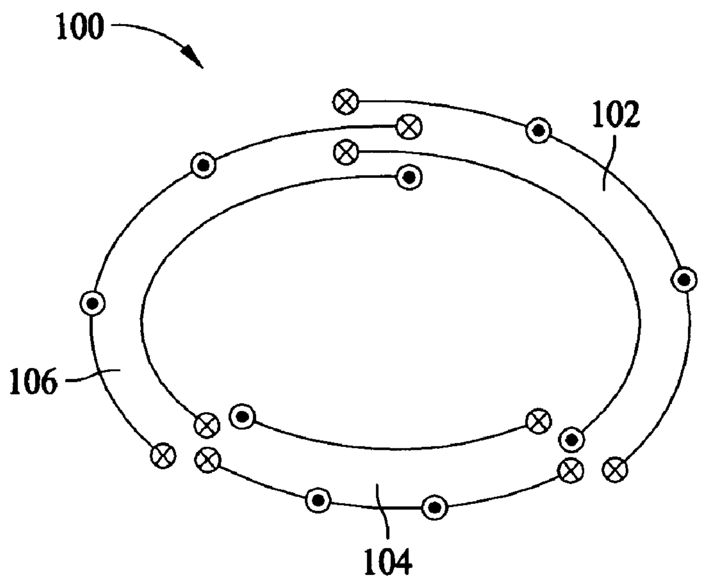
FIG. 16 is an elevation view of a schematic diagram of a tenth exemplary coil array according to the invention.

Referring to FIG. 16, this is a coil array 100 where combinations of three quadrature coils 102, 104, 106 (i.e., a loop coil and a butterfly/saddle/"Figure-8" coil) are used, each having different curvature and size for optimized S/N. Although a configuration where adjacent coils are overlapped is shown, overlapping is not necessary when a low-input impedance preamplifier decoupling technique is employed, for instance. In parallel imaging modality, the elements of a coil array should be smaller than for common phased-array imaging, resulting in a trade-off between basic noise and geometry factor. Non-overlapping configuration may yield a net gain in S/N due to the improved geometry factor when using SENSE.

Figure 17:
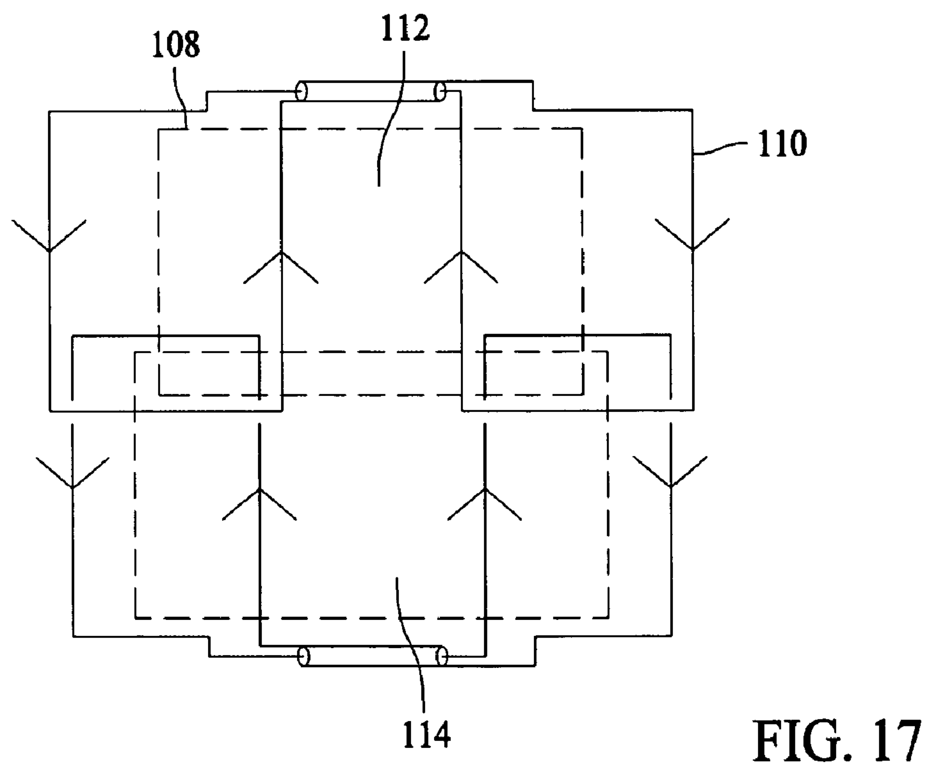
FIG. 17 is a plan view of a schematic diagram of an eleventh exemplary coil array according to the invention.

Referring to FIG. 17, a loop coil 108 in dashed lines and an MCLP coil 110 shown in black constitute a quadrature coil 112 since the MCLP coil functions as a "Figure 8" or saddle coil. The cables connecting two loops to form an MCLP coil can be 75 ohms or 50 ohms. Another pair of the loop-MCLP quadrature coil 114 is distributed in the z direction to cover a large FOV. The loop-MCLP quadrature coil can be distributed around a human body not only in a circumambient direction (m=1, 2, 3, 4 . . . ) but also in the z direction (n=1, 2, 3, 4 . . . ).

Figure 18:
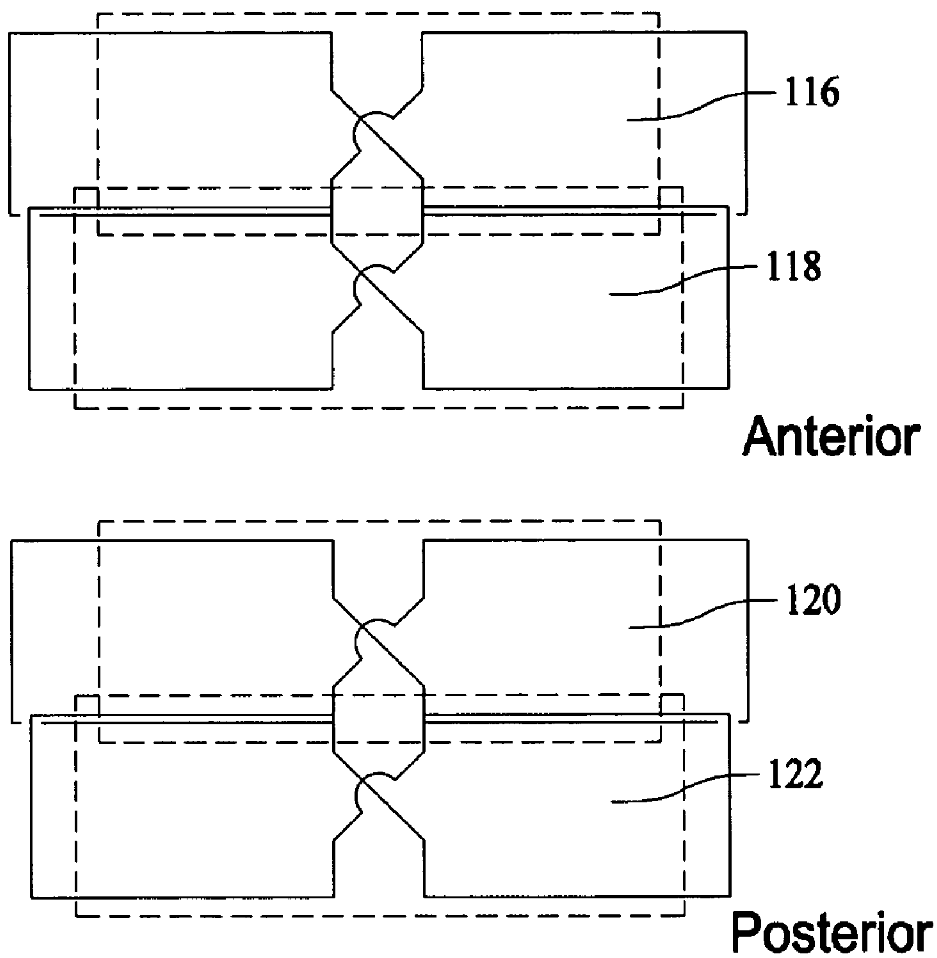
FIG. 18 is a plan view of a schematic diagram of a twelfth exemplary coil array according to the invention.

Referring to FIG. 18,: Two pairs of loop-saddle quadrature coils 116, 118 are distributed in the z direction to form an anterior coil, and another two pairs of the loop-saddle quadrature coils 120, 122 are placed on a posterior coil. The "Figure-8" or saddle coils can be replaced by MCLP coils.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A partially parallel acquisition RF coil array for imaging a sample, said array comprising: at least a first, a second and a third coil, said first, second and third coils each extending partly circumambiently around a portion of a single radial region to be imaged and together said first, second and third coils forming a single coil array extending circumambiently around said single radial region of the sample, said coil array configured to provide both contrast data and spatial phase encoding data.

2. An array of RF coils according to claim 1, wherein at least two of said coils are quadrature coils.

3. An array of RF coils according to claim 1, wherein said coils are quadrature coils.

4. An array of RF coils according to claim 1, wherein said coils are quadrature ladder/half-bird cage coils.

5. An array of RF coils according to claim 1, wherein said coils are quadrature loop-and-butterfly coils.

6. An array of RF coils according to claim 1, further comprising a fourth, a fifth and a sixth coil in said circumambient arrangement, wherein said first and second coils are quadrature ladder/half-bird cage coils and said third, fourth, fifth and sixth coils are loop coils.

7. An array of RF coils according to claim 1, further comprising a fourth and a fifth coil in said circumambient arrangement, wherein said first and second coils are quadrature ladder/half-bird cage coils and said third and fourth coils are loop coils, and said fifth coil is a quadrature loop-and-butterfly coil.

8. An array of RF coils according to claim 1, further comprising a fourth coil in said circumambient arrangement, wherein said first, second, third and fourth coils are quadrature ladder/half-bird cage coils.

9. An array of RF coils according to claim 1, further comprising a fourth coil in said circumambient arrangement, wherein said first and second coils are quadrature ladder/half-bird cage coils and said third and fourth coils are quadrature loop-and-butterfly coils.

10. An array of RF coils according to claim 1, further comprising a fourth coil in said circumambient arrangement, wherein said first, second, third and fourth coils are quadrature loop-and-butterfly coils.

11. An array for parallel imaging comprising:

a plurality of coils each extending partly circumambiently around a portion of a single radial region of a sample to be imaged, said plurality of coils providing contrast and spatial phase encoding data, said plurality of coils configured to be arranged in combination as a single coil array, and said plurality of coils forming a single coil array extending circumambiently around said single radial region.

12. An array according to claim 11, wherein at least two of said plurality of coils comprise quadrature coils.

13. An array according to claim 11, wherein at least two of said plurality of coils comprise quadrature ladder/half-bird cage coils.

14. An array according to claim 11, wherein at least two of said plurality of coils comprise quadrature loop-and-butterfly coils.

15. An array according to claim 11, wherein said plurality of coils comprise at least three coils configured to be arranged in combination circumambiently about a sample.

16. An array according to claim 11, wherein said plurality of coils comprise at least two sets of three coils, each set configured to be arranged in combination circumambiently about a sample.

17. An array according to claim 11, wherein at least two of said plurality of coils are overlapping.

18. An array according to claim 11, wherein said plurality of coils are non-overlapping.

19. A method for parallel imaging comprising:

arranging a plurality of coils in combination as a coil array such that each of the plurality of coils is configured to extend partially circumambiently around a portion of a single radial region of a sample, said coils together extending circumambiently around said single radial region.

20. A method according to claim 19, wherein said arranging comprises forming a single circumambient array of coils.

* * * * *